United States Patent [19]

Barnes et al.

[11] Patent Number: 5,589,737
[45] Date of Patent: Dec. 31, 1996

[54] PLASMA PROCESSOR FOR LARGE WORKPIECES

[75] Inventors: Michael Barnes, San Francisco; Neil Benjamin, E.P.A.; John Holland, Santa Clara; Richard Beer, Sunnyvale; Robert Veltrop, Saratoga, all of Calif.

[73] Assignee: LAM Research Corporation, Fremont, Calif.

[21] Appl. No.: 354,122

[22] Filed: Dec. 6, 1994

[51] Int. Cl.⁶ .................................................. H01J 7/24
[52] U.S. Cl. ............................. 315/111.21; 315/111.51; 315/111.71; 219/121.52; 219/121.43
[58] Field of Search ................... 315/111.21, 111.41, 315/111.51, 111.71, 236, 344, 338; 219/121.41, 121.43, 121.36, 121.52; 118/723 R

[56] References Cited

U.S. PATENT DOCUMENTS

| | | | |
|---|---|---|---|
| 4,948,458 | 8/1990 | Ogle | 156/643 |
| 5,079,481 | 1/1992 | Moslehi | 315/111.41 |
| 5,081,398 | 1/1992 | Asmussen et al. | 315/111.41 |
| 5,099,571 | 3/1992 | Logan et al. | 29/825 |
| 5,144,196 | 9/1992 | Gegenwart et al. | 315/111.41 |
| 5,231,334 | 7/1993 | Paranjpe | 315/111.21 |
| 5,234,529 | 8/1993 | Johnson | 156/345 |
| 5,261,962 | 11/1993 | Hamamoto et al. | 118/723 |
| 5,277,751 | 1/1994 | Ogle | 156/643 |
| 5,280,154 | 1/1994 | Cuomo et al. | 219/121.52 |
| 5,304,279 | 4/1994 | Coultas et al. | 156/345 |
| 5,309,063 | 5/1994 | Singh | 315/111.51 |

FOREIGN PATENT DOCUMENTS

| | | |
|---|---|---|
| 0344885A | 12/1989 | European Pat. Off. . |
| 0517042A1 | 12/1992 | European Pat. Off. . |
| 0593924A1 | 4/1994 | European Pat. Off. . |
| 2131600 | 6/1984 | United Kingdom . |

*Primary Examiner*—Robert Pascal
*Assistant Examiner*—Haissa Philogene
*Attorney, Agent, or Firm*—Lowe, Price, LeBlanc & Becker

[57] ABSTRACT

A plasma processor for large workpieces includes a vacuum chamber having plural individually supported dielectric windows for coupling an r.f. field originating outside of the chamber into the chamber to excite the plasma. A planar coil for inductively deriving the field has plural segments with the same electrical length, each including an element connected in parallel with an element of another segment.

36 Claims, 10 Drawing Sheets

PLASMA PROCESSOR FOR LARGE WORKPIECES

FIELD OF INVENTION

The present invention relates generally to processors for treating workpieces in a vacuum chamber with a plasma and more particularly to such a processor having plural individually supported dielectric windows for coupling an r.f. field originating outside of the chamber into the chamber to excite the plasma and/or a coil for inductively deriving the field, wherein the coil has plural segments with the same electrical length, each including an element connected in parallel with an element of another segment.

BACKGROUND ART

Various structures have been developed to supply r.f. fields from devices outside of a vacuum chamber to excite a gas in the chamber to a plasma state. The r.f. fields have been derived from electric field sources including capacitive electrodes, electromagnetic field sources including electron cyclotron resonators and induction, i.e. magnetic, field sources including coils. The excited plasma interacts with the workpiece to etch the workpiece or deposit materials on it. Typically, the workpiece is a semiconductor wafer having a planar circular surface.

A processor for treating workpieces with an inductively coupled planar plasma (ICP) is disclosed, inter alia, by Ogle, U.S. Pat. No. 4,948,458, commonly assigned with the present invention. The magnetic field is derived from a planar coil positioned on or adjacent a single planar dielectric window that extends in a direction generally parallel to the workpiece planar surface. In commercial devices the window is usually quartz because this material has low impurity content and provides optimum results for r.f. field coupling. The coil is connected to be responsive to an r.f. source having a frequency in the range of 1 to 100 MHz and coupled to the coil by an impedance matching network including a circuit resonant to the frequency of the source. The coil is disclosed as a planar spiral having external and internal terminals connected to be responsive to the r.f. source. The circular spiral coil disclosed by Ogle has been modified to include linear, elongated elements generally in a spiral configuration, to process workpieces having square and rectangular shapes. Coultas et al., U.S. Pat. No. 5,304,279 discloses a similar device employing permanent magnets in combination with the planar spiral coil.

Cuomo et al., U.S. Pat. No. 5,280,154 and Ogle, U.S. Pat. No. 5,277,751 disclose a variation of the aforementioned processor wherein the linear spiral coil is replaced by a solenoidal coil. The solenoidal coil is wound on a dielectric mandrel or the like and includes plural helical-like turns, a portion of which extend along the dielectric window surface. The remainder of the coil extends above the dielectric window. Opposite ends of the solenoidal coil are connected to an r.f. excitation source.

None of the prior art plasma processors with which we are familiar is well adapted to excite plasmas for processing very large substrates, for example, substrates used in forming rectangular flat panel displays having sides in the range of 30–100 cm. Excitation of plasmas for treating, i.e., processing, such large substrates requires coils having correspondingly large surface areas in contact with or adjacent a dielectric window structure having a large surface area, commensurate with the areas of the workpieces to be treated. If these prior art structures are used for exciting plasmas for treating large workpieces, numerous problems which apparently have not been previously considered or resolved arise.

A problem common to all of the prior art processor designs is that the windows must be increased to a substantial thickness as the area thereof increases. Otherwise, the windows would not withstand the differential pressure between the atmospheric pressure outside of the chamber and the vacuum in the chamber; e.g. to process workpieces having rectangular treatment surfaces of about 75 cm×80 cm, a single quartz window having a surface of approximately 80 cm×85 cm must have a thickness in excess of 5 cm. Quartz windows of the stated area and thickness are also very expensive and fragile so use thereof considerably increases the cost of the processor. In addition, we have found that the r.f. fields derived from excitation sources using prior art processor designs are not usually capable of effectively exciting the plasma in a vacuum chamber with a large area, thick window. This is because the r.f. fields do not have sufficient flux density, after penetrating the thick window, to provide the required excitation. For example, the magnetic flux density penetrating a 5 cm thick dielectric window from a coil has a much smaller number of effective magnetic lines of flux than the magnetic field penetrating a 2.5 cm thick window of a prior art device for treating circular wafers having a 20 cm diameter. It is not feasible to simply increase magnetic flux density by increasing current from an r.f. source driving the coil because the increased current can cause excessive heating of the coil as well as other components and because of the difficulty in obtaining suitable high power r.f. sources.

A problem peculiar to the use of prior art induction coils for exciting a plasma having a large surface area is non-uniform excitation of the plasma, resulting in non-uniform plasma density and uneven workpiece processing. We have realized this non-uniform distribution occurs in part because the prior art coils function as transmission lines likely to have lengths, when laid over a large surface window, approaching or exceeding one-eighth wavelength of the r.f. driving sources. Because of the coil length there are significant voltage and current variations along the coil, resulting in appreciable magnetic flux density variations in the plasma. If the coil has a length in excess of one-eighth wavelength of the r.f. source there is an RMS voltage null in a coil driven by a current having an RMS peak value because of the substantial mismatch between the source and the load driven thereby. The mismatch causes the coil voltage and current to be phase displaced by close to 90°, resulting in the voltage null. These magnetic flux density variations cause the non-uniform gas excitation and uneven workpiece processing.

We have realized that the length of the coil between terminals thereof connected to the r.f. source must be considerably less than one-eighth of a wavelength of the r.f. source output and that such a result can be achieved by providing a coil with plural parallel branch elements or segments. While Hamamoto et al., U.S. Pat. No. 5,261,962 discloses a planar plasma excitation coil having plural parallel branch segments connected in a ladder configuration to a pair of physically opposed terminals connected to the same ends of leads connected to the branch segments, the structure in Hamamoto et al. is not suitable for use over a large surface area window. If Hamamoto et al. were used on large area windows there would be a tendency for uneven flux distribution and non-uniform plasma density because the different branches are included in r.f. transmission lines with different lengths across the opposed terminals. Hence, the branch segment physically closest to the terminals is in the shortest length line, while the branch segment physically farthest from the terminals is in the longest length line. The different length lines draw different currents from the source so the portion of the plasma adjacent the shortest length line is excited to a considerably greater degree than the plasma portion adjacent the longest length line. This causes non-uniform plasma excitation in processors for treating large surface area workpieces.

It is, accordingly, an object of the present invention to provide a new and improved r.f. field excited plasma processor particularly adapted for treating large workpieces.

A further object of the invention is to provide a new and improved r.f. field excited plasma processor for large workpieces wherein the plasma is uniformly distributed over the workpiece.

Another object of the invention is to provide a new and improved r.f. field excited plasma processor vacuum chamber arrangement particularly adapted for relatively large workpieces wherein dielectric coupling windows are arranged to withstand the differential pressure between the chamber interior and exterior while being thin enough to couple r.f. fields with sufficient density to effectively excite the plasma.

An additional object of the invention is to provide a new and improved r.f. field excited plasma workpiece processor wherein a plasma is inductively excited in an efficient manner to provide relatively uniform plasma distribution for large workpieces.

An added object is to provide a new and improved r.f. field excited plasma processor having plural electrically parallel coil segment branches arranged to supply about the same excitation flux to the plasma.

Yet a further object is to provide a new and improved r.f. field excited plasma processor having plural electrically parallel coil segment branches having about the same electrical and physical lengths to provide uniform flux distribution to the plasma and simplify design of the coil.

THE INVENTION

In accordance with one aspect of the present invention, some of the foregoing objects are attained by providing a processor for treating a large workpiece with a plasma comprising a vacuum chamber in which the workpiece is adapted to be mounted. A gas which can be converted into the plasma for treating the workpiece is supplied to the chamber. The gas is excited into the plasma state by an r.f. electric source outside of the vacuum. The r.f. source derives a field that is coupled to the plasma via plural individually supported dielectric windows on a wall of the chamber. Because there are plural individually supported windows, rather than a single large window, each window can be thin enough, e.g. 2.5 cm, to provide effective coupling of the r.f. field to the plasma.

In accordance with another aspect of the invention, other objects of the invention are attained by providing a processor for treating a workpiece with a plasma comprising a vacuum chamber in which the workpiece is adapted to be mounted. The chamber has introduced into it a gas which can be converted into the plasma for treating the workpiece. A means for converting the gas into the plasma includes a coil positioned to couple an r.f. magnetic field to the gas via a dielectric window structure on a wall of the chamber to excite the gas to produce and maintain the plasma. The coil includes first and second terminals adapted to be connected to an r.f. source that causes the r.f. magnetic field to be derived, as well as plural winding segments electrically connected between the first and second terminals so they have about the same electric length. Each segment includes an element that is electrically in parallel with elements of the other segments. Thereby, the RMS amplitude of the AC current flowing in the different coil elements is about the same to provide a relatively uniform magnetic flux distribution in the plasma.

In certain preferred embodiments, first and second terminals of the coil and the coil segments are positioned and arranged so the electrical and physical lengths of current paths are approximately the same between the first and second terminals via at least two, and in some embodiments all, of the coil segments. A particularly advantageous arrangement including this feature comprises plural physically and electrically parallel branch conductor elements connected to leads extending at right angles to the elements, wherein the first and second terminals are at diagonally opposite ends of the leads. The like electric length lines can also be attained by proper design of the cross section geometry of conductors in the lines to provide lines with different inductive values and/or by inserting capacitors having appropriate values in series with the parallel coil elements.

The above and still further objects, features and advantages of the present invention will become apparent upon consideration of the following detailed descriptions of specific embodiments thereof, especially when taken in conjunction with the accompanying drawings.

DESCRIPTION OF THE PREFERRED EMBODIMENTS

Figure 1:
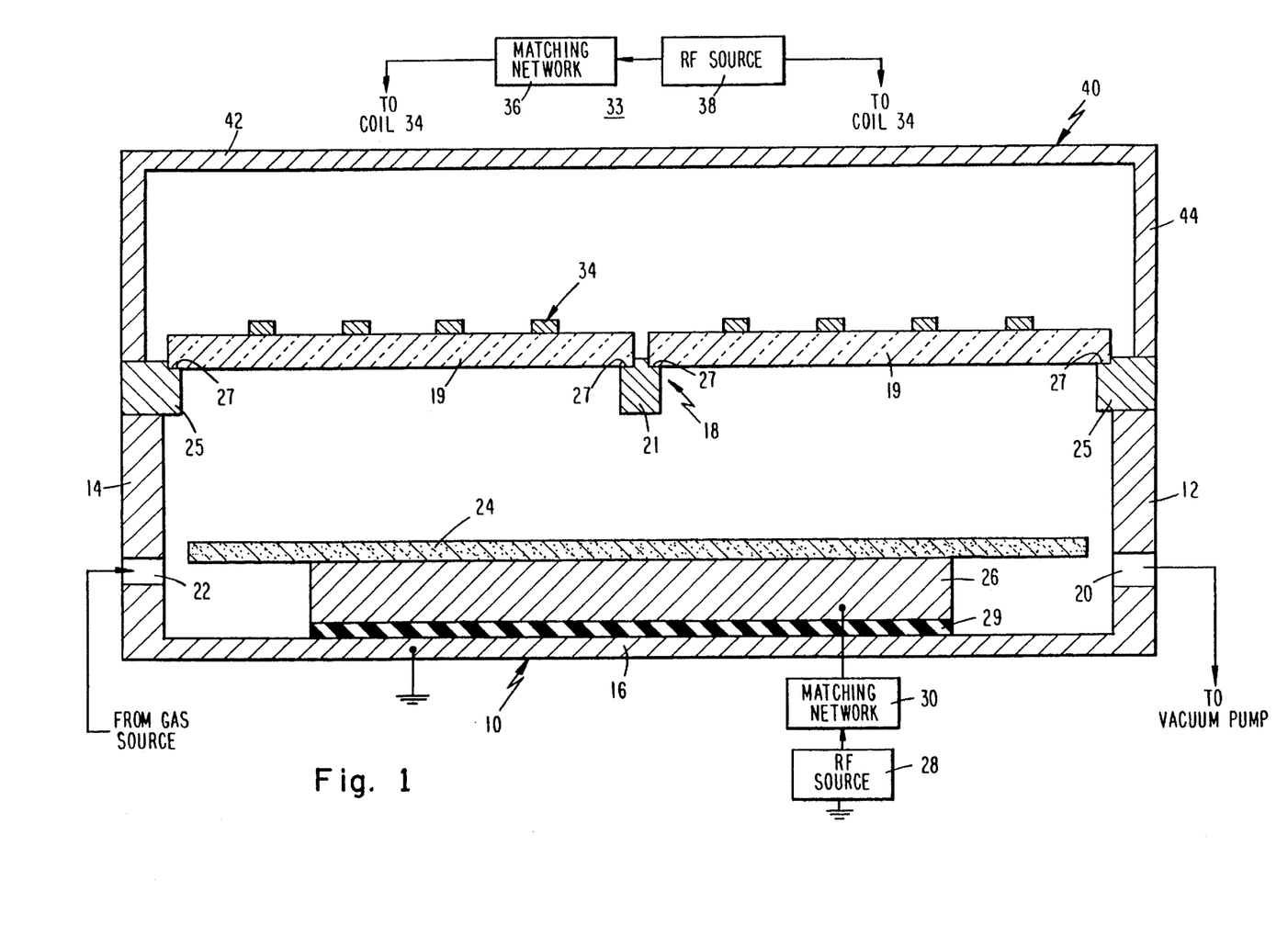
FIG. 1 is a side sectional view of a plasma processor in accordance with one embodiment of the present invention.
Figure 1A:
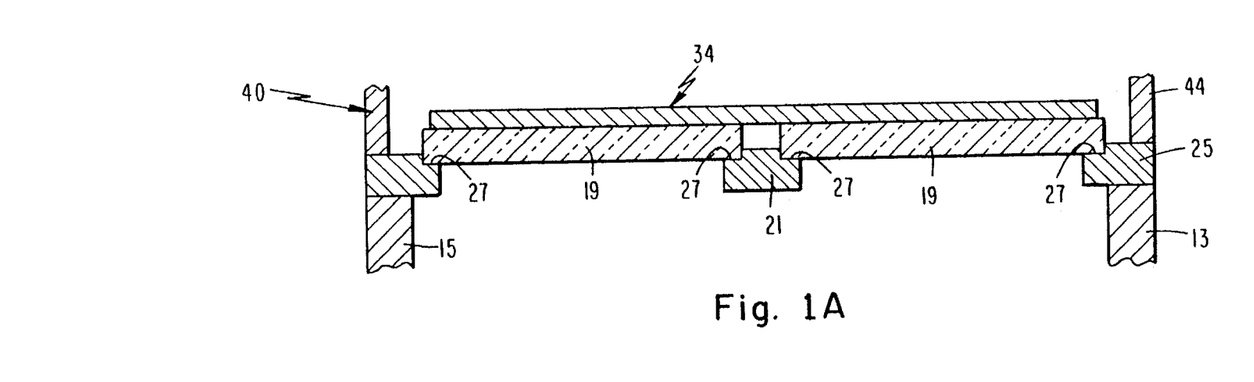
FIG. 1a is a side sectional view, at right angles to the view of FIG. 1 of a portion of the plasma processor illustrated in FIG. 1.

Reference is now made to FIGS. 1 and 1(a) of the drawing, wherein a workpiece processor is illustrated as including vacuum chamber 10, shaped as a right parallelepiped having electrically grounded, sealed exterior surfaces formed by rectangular metal, preferably anodized aluminum, sidewalls 12 and 14 that extend parallel to each other and at right angles to rectangular metal sidewalls 13 and 15. Vacuum chamber 10 also includes rectangular metal, preferably anodized aluminum, bottom end plate 16 and rectangular top end plate structure 18, including four individually supported dielectric, rectangular windows 19 having substantially the same size. Sealing of these exterior surfaces of chamber 10 is provided by conventional gaskets (not shown).

Windows 19, preferably made of quartz, are individually supported by one-piece, rigid frame 23, made of a non-magnetic metal, such as anodized aluminum. Frame 23 includes peripheral, mutually perpendicular legs 25 and interior mutually perpendicular rails 21, connected to the centers of the legs. Rails 21 and legs 25 include notches 27, which individually support each of windows 19 since the side walls of the windows and the bottom portions of the windows adjacent the side walls fit in and rest on gaskets (not shown) on the bottoms and side walls of the notches. Legs 25 of frame 21 are bonded to side walls 12–15 of chamber 10. Because windows 19 are individually supported by rails 21 and legs 25, the thickness of windows 19 can be less than about 2.5 cm and withstand the pressure differential between the atmospheric air on the exterior of chamber 10 and the vacuum inside the chamber, which is typically in the 0.5–5 milliTorr range. If windows 19 were not individually supported and a single window were employed, such a single window would have to have a thickness of at least 5 cm to be able to withstand the differential pressure. Such a thick window would significantly reduce the amount of r.f. field energy that could be coupled through the windows and would be very expensive. In one configuration of chamber 10 for processing large workpieces, e.g. television receiver active matrix liquid crystal displays having a planar rectangular configuration with sides as large as 75 cm×85 cm, each of windows 19 has an area of about 40 cm.×43 cm.

Sidewall 12 includes port 20, connected to a conduit (not shown) leading to a vacuum pump (not shown) which maintains the interior of chamber 10 at a pressure on the order of 0.5–5 milliTorr. A gas which can be excited to a plasma, of a type well known in the prior art, is introduced from a suitable source (not shown) into chamber 10 via port 22 on sidewall 14.

Workpiece 24, e.g. a large semiconductor substrate wafer having a rectangular shape as specified supra, is mounted on metal chuck 26 in a plane parallel to the planes of bottom end plate 16 and windows 19, and close to plate 16. An electric field, typically having a frequency of about 30 MHz, is applied to workpiece 24 by r.f. source 28 via impedance matching network 30 and chuck 26. Chuck 26 is electrically insulated from the remaining metal parts of chamber 10 because it rests on electric insulator pad 29. Dielectric end plate structure 18 carries planar coil 34, connected to r.f. excitation device 33 including impedance matching network 36 and r.f. source 38, having a frequency different from r.f. source 28, and preferably equal to approximately 13.3 MHz. Both terminals of source 38 can float or one of them can be grounded to the metal walls of chamber 10. Matching network 36 includes circuitry tuned to the frequency of source 38 to form a resonant coupling circuit. Coil 34 is positioned and responds to source 38 to supply r.f. magnetic lines of flux to the gas coupled through port 22, to excite the gas to a plasma state. The plasma treats workpiece 24 to etch the substrate or to deposit molecules thereon.

Planar coil 34 can have many different configurations, as illustrated, for example, in FIGS. 2–10. Each of these coil configurations includes multiple linear electrically conducting, metal (preferably silver coated copper) stripe elements or segments for inductively supplying magnetic lines of flux to the gas in chamber 10 to sustain and generate a planar plasma that processes workpieces 24 in chamber 10. The linear elements of coil 34 preferably have a rectangular cross section with a broad side fixedly positioned on dielectric end face structure 18, although the narrow sides of the elements could be fixedly mounted on window 19. Coil 34 is basically an r.f. transmission line including distributed series inductances resulting from the self inductance of the metal elements and shunt capacitances between the metal elements and the grounded chamber exterior walls. To excite and maintain the plasma for these purposes, source 30 supplies up to 30 amperes to coil 34.

To confine and concentrate magnetic field lines resulting from current flowing through the linear conductors of coil 34, magnetic shield cover 40, preferably made of aluminum in which r.f. eddy currents are induced by the r.f. magnetic flux lines, surrounds the sides and top of the coil. Cover 40 has a roof 42 and four sidewalls 44, that are fixedly attached to vacuum chamber 10.

Figure 2:
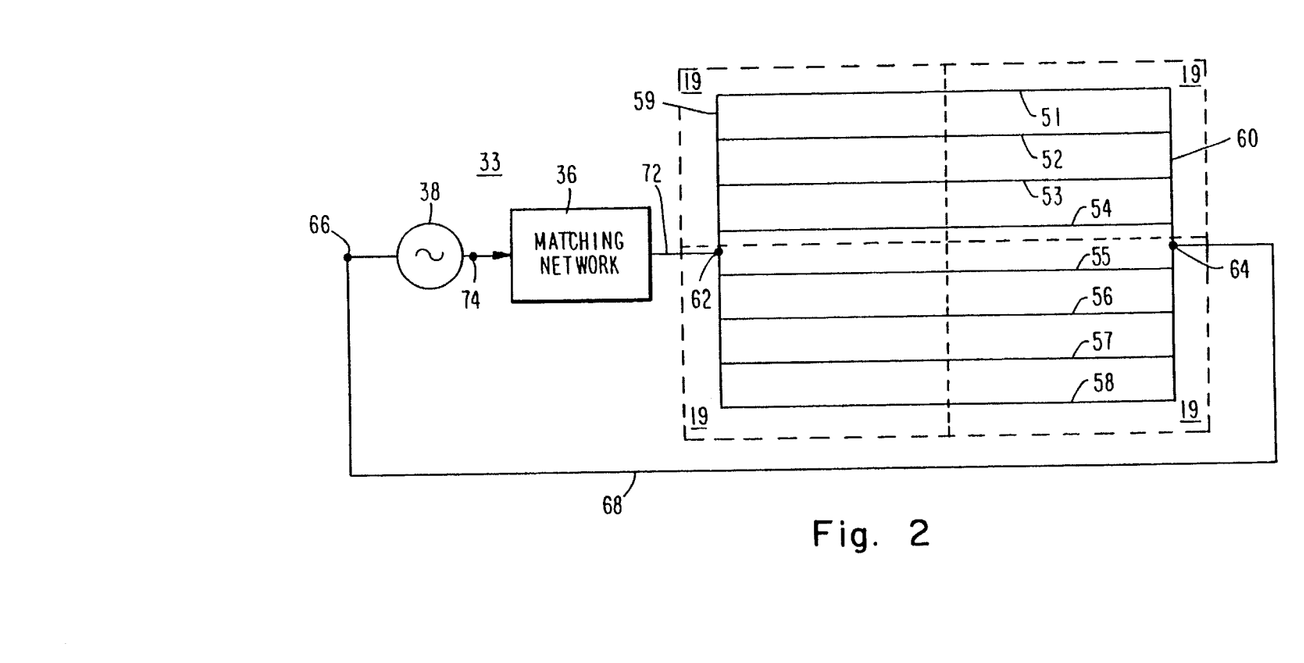
FIG. 2 is top view of a coil employing plural parallel linear conductor segments or elements, wherein all of the currents flow in the same direction through the segments.

According to one embodiment, illustrated in FIG. 2, coil 34, that extends over all four of windows 19, has a configuration including eight elongated, straight, linear, metal conducting elements 51–58 having opposite ends connected to elongated straight, metal (preferably silver coated copper) leads 59 and 60 which extend parallel to each other and at right angles to elements 51–58. The bottom faces of elements 51–58 and leads 59, 60 are bonded to windows 19, except the portions of elements 51–58 which span gaps 31 across rail 21, between interior edges of the windows, as illustrated in FIG. 1a. Conducting elements 51–58 are approximately equidistant from each other (except for the spacing between central elements 54 and 55 which is somewhat different because of center rail 21), have about the same length and extend parallel to each other. Leads 59 and 60 include central terminals 62 and 64, located midway between central conductors 54 and 55. Terminals 62 and 64 are respectively connected to terminal 66 of r.f. source 38 by cable 68 and to output terminal 70 of matching network 36 by cable 72. Matching network 36 is connected to output terminal 74 of r.f. source 38.

Figure 11:
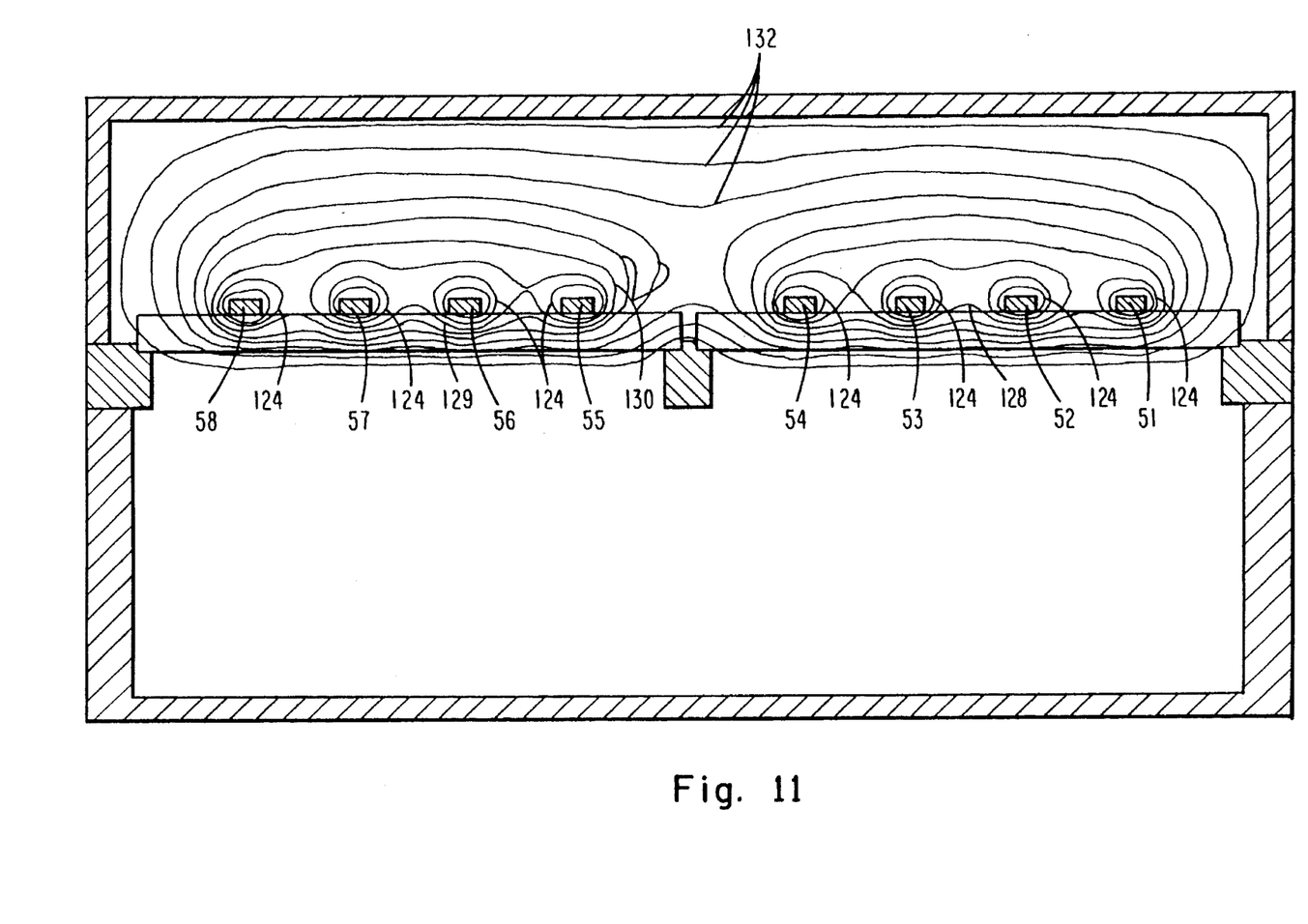
FIG. 11 is a side view of magnetic flux lines produced as a result of excitation of the coil configurations of FIGS. 2–4 and 9.

In response to the output of r.f. source 38, current flows through each of conducting elements 51–54 generally in the same direction at any instant to produce r.f. magnetic flux lines 124, 128, 130 and 132, FIG. 11. Because the lengths of each of conducting elements 51–58 is a relatively small fraction, e.g. about 1/16th, of a wavelength ($\lambda$) of the frequency derived from r.f. source 38, the instantaneous current and voltage variations across each of the conducting elements is not substantial. Because central conducting elements 54 and 55 have the same length, same cross sectional geometry and are equispaced from terminals 62 and 64, the lengths of the current paths formed by the transmission lines from terminal 62 to terminal 64 through conducting elements 54 and 55 are the same, whereby the magnetic flux densities resulting from the substantially equal RMS amplitude r.f. currents flowing through conducting elements 54 and 55 are approximately the same. Similarly, slightly off-center conducting elements 53 and 56 have equal length transmission lines and current paths between terminals 62 and 64 so the magnetic flux densities resulting from the substantially equal RMS amplitude currents flowing through them are about equal.

Because the lengths of the transmission lines and current paths through conducting elements 53 and 55 are somewhat greater than those through elements 54 and 55, there is a tendency for the RMS values of the r.f. currents flowing through elements 53 and 56 to be somewhat less than those through elements 54 and 55, whereby the magnetic flux densities derived from elements 53 and 56 tend to be less than those from elements 54 and 55. By the same reasoning, magnetic flux densities resulting from r.f. excitation of conducting elements 52 and 57 are approximately the same and tend to be less than those resulting from current flowing through conducting elements 53 and 56; the same is true for conducting elements 51 and 58.

As a result of the differential lengths of the transmission lines and the resulting differences in current path lengths from terminals 62 and 64 through different ones of elements 51–58 there are differences in the excitation and distribution of the plasma in chamber 10. This is likely to lead to uneven plasma processing of the large surface area workpiece because there is greater plasma density in the workpiece central region (beneath elements 54 and 55) than the workpiece periphery (beneath elements 51 and 58).

According to one aspect of the invention, the lengths of the transmission lines including elements 51–58 are approximately electrically equalized by providing the different lines with reactances having different values. Since the self inductance of a single electric line is inversely proportional to the line cross sectional area and the inductance of a line increases as the line length increases, the lines closest to terminals 62 and 64 can be made electrically longer by decreasing the cross sectional areas thereof relative to the cross sectional areas of the lines farther from the terminals. It is also desirable to maintain the electrical length of each of elements 51–58 the same so the RMS voltage and current variations across them are equalized to provide the same plasma distribution below these elements.

To these ends, the cross sectional areas of leads 59 and 60 progressively increase between adjacent pairs of segments 55–58 and 51–54 while the cross sectional areas of segments 51–58 are the same. Hence, leads 59 and 60 have relatively small cross sectional areas between segments 55 and 56 as well as between segments 53 and 54 and relatively large cross sectional areas between segments 57 and 58 as well as between segments 51 and 52.

Figure 2A:
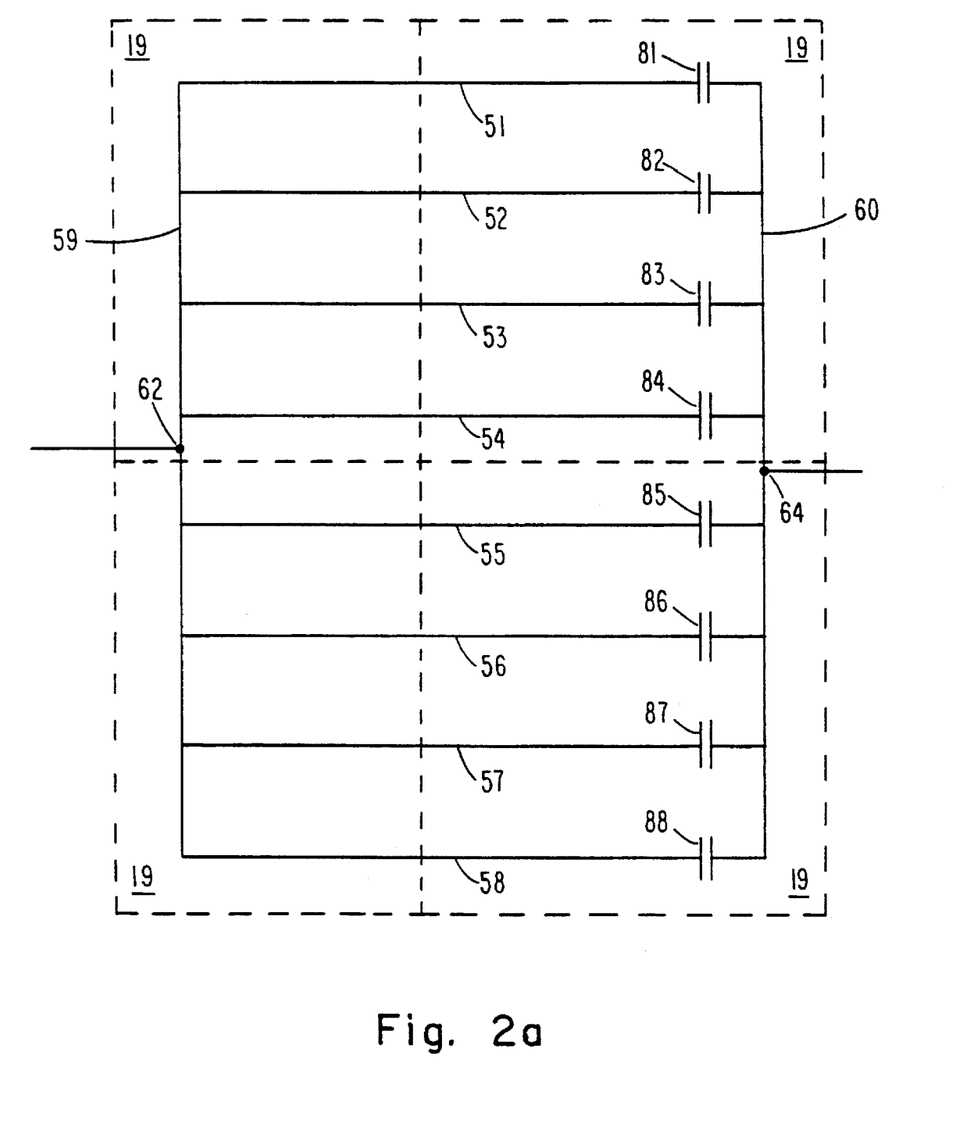
FIG. 2a is a top view of a portion of a modified version of FIG. 2.

Alternatively, capacitors 81–88 are connected in series with elements 51–58 to equalize the lengths of the transmission lines. As illustrated in FIG. 2a, capacitors 81–88 are connected in series with elements 51–58 and lead 59, at the end of each element adjacent the lead. These locations for capacitors 81–88 do not affect the effective physical lengths of elements 51–58 because of the relatively small physical size of the capacitors.

To enable the phase of the currents in each of elements 51–58 to be generally the same (either leading or lagging the voltage across the element) the geometry of elements 51–58 and the values of capacitors 81–88 are selected so the net impedance at the frequency of source 38 of each of the branches including elements 51–58 is of the same reactance type, i.e. either inductive or capacitive. If the inductive impedance of elements 51–58 is dominant, each of series capacitors 81–88 has a relatively large value, to provide a relatively small capacitive impedance in series with each element. Hence, capacitors 84 and 85 in series with elements 54 and 55 have smaller values than capacitors 83 and 86 in series with elements 53 and 56, capacitors 83 and 86 in series with elements 53 and 56 have smaller values than capacitors 82 and 87 in series with elements 52 and 57, etc. so that capacitors 81 and 88 in series with elements 51 and 58 have the largest values or may be eliminated. If, however, the dominant impedance in the branches including elements 51–58 is capacitive, the values of capacitors 81–88 are relatively small to provide high capacitive impedances; the values of pairs of capacitors 84, 85, 83, 86, 82, 87, 81, 88 progressively decrease in the order named.

Figure 3:
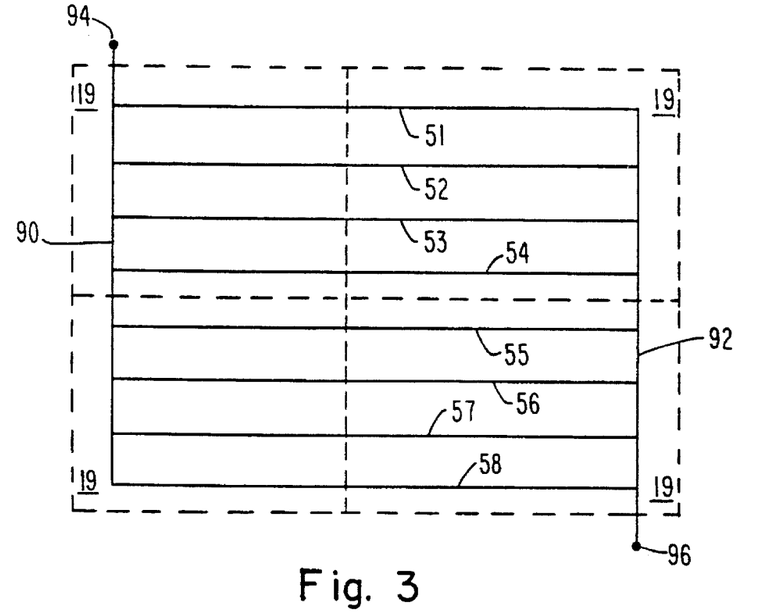
FIG. 3 is a top view of a coil including parallel segments having currents flowing through them in the same direction, wherein the segments are in paths having equal physical and electrical lengths between diagonally opposite first and second terminals connected to be responsive to an r.f. excitation source.

Reference is now made to FIG. 3 of the drawing, wherein coil 34 is illustrated as including linear conducting elements 51–58, arranged and constructed the same as conducting elements 51–58 of FIG. 2. In FIG. 3 conducting elements 51–58 have opposite ends connected to straight elongated metal leads 90 and 92 that extend parallel to each other and at right angles to conducting elements 51–58. Leads 90 and 92 have large cross sectional areas resulting in small inductances that do not introduce appreciable transmission line lengths or phase shifts in the paths leading to and from elements 51–58. Lead 90 includes a portion which ends at terminal 94 and extends slightly beyond conductor 51; similarly, lead 92 includes a portion which ends at terminal 96 and extends slightly beyond lead 50. Terminals 94 and 96 are connected to the same leads and circuitry as terminals 62 and 64, respectively.

An advantage of the structure illustrated in FIG. 3 is that the current path through each of conducting elements 51–58 between terminals 94 and 96 has the same physical and electrical length. Thereby, the RMS amplitude of the AC current flowing in each of conducting elements 51–58 is virtually the same. Because the RMS amplitude of the AC current flowing in each of conducting elements 51–58 is about the same, the magnetic flux densities resulting from excitation of these conducting elements by the r.f. source 38 is about the same.

The magnetic flux lines resulting from r.f. excitation of conducting elements 51–58 produce r.f. magnetic flux lines 124, 128, 130 and 132 (FIG. 11) in the gas introduced into chamber 10, to excite the gas to a plasma having equal numbers of positive and negative charged carriers. Because of the resulting molecular flux in the plasma, the plasma functions as a single turn secondary winding of a transformer including, as its primary windings, conducting elements 51–58. The conducting properties of the plasma cause r.f. magnetic flux lines 124, 128, 130 and 132 to be asymmetrical, i.e., the magnetic flux lines extend above windows 19 into the atmosphere to a considerably greater extent than below the windows into vacuum chamber 10. The charged carriers disperse through the gas to cause the volume of gas to be a plasma for treating substrate or workpiece 24.

Figure 4:
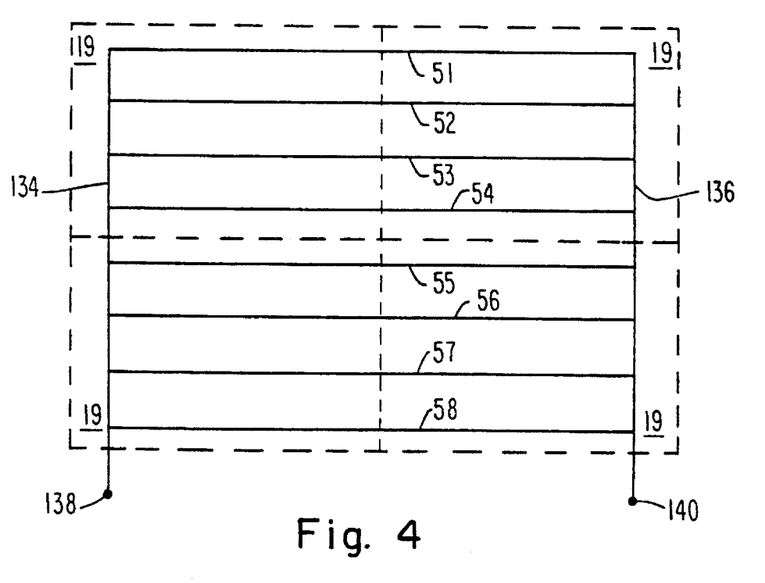
FIG. 4 is a top view of a further coil configuration wherein all of the currents flow in parallel branches in the same direction between first and second adjacent terminals connected to an AC excitation source.

Reference is now made to FIG. 4 of the drawing, a further configuration of coil 34, including elongated straight leads 134 and 136, that extend parallel to each other and include end terminals 138 and 140, respectively connected to r.f. exciting device 33 via cables 72 and 68. Extending between leads 134 and 136 are linear, parallel elongated conducting elements 51–58 which are identical to the corresponding elements of FIGS. 2 and 3. Elements 51–58 are driven by r.f. exciting device 33 so that at any instant of time, r.f. parallel currents generally flow through them in the same direction. Leads 134 and 136 and elements 51–58 of FIG. 4 are arranged so end terminals 138 and 140 are at the same ends of the leads relative to the conducting elements and the terminals are spaced from each other by the lengths of the conducting elements. To enable the coil configuration of FIG. 4 to include equal electrical length transmission lines through elements 51–58 from terminals 138 and 140 via leads 134 and 136, the cross section geometry of different parts of the leads can differ, as discussed in connection with FIG. 2, and/or capacitors can be connected in series with elements 51–58 as discussed in connection with FIG. 2a.

As a result of the currents flowing in like directions through conducting elements 51–58 in each of FIGS. 2–4, there is at least one magnetic flux line 124 (FIG. 11) surrounding each of the conducting elements and there is a cumulative effect caused by the interaction of magnetic fluxes resulting from the currents flowing in elements 51–58. Thereby, a highly concentrated, evenly distributed, magnetic field is provided in the plasma beneath windows 19. For example, the like directed currents flowing through conducting elements 52 and 53 or through elements 56 and 57 cause these two pairs of conducting elements to be surrounded by magnetic flux lines 128 and 129, respectively. The interaction between the magnetic fluxes resulting from currents flowing in a like direction in conducting elements 55–58 causes these conducting elements to be surrounded by magnetic flux lines 130. An interaction between the magnetic fluxes resulting from currents flowing in a like direction through all of conducting elements 51–58 causes elements 51–58 to be surrounded by magnetic flux lines 132. The concentrated magnetic flux lines resulting from the excitation patterns of conducting elements 51–58 provide a relatively uniform distribution of plasma in chamber 10 beneath top end plate structure 18 so there is an even distribution of etchant or deposited molecules on workpiece 24.

Figure 5:
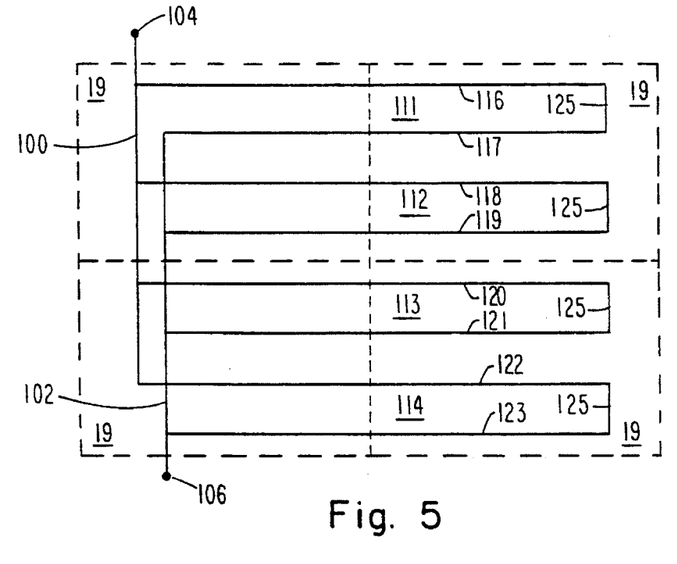
FIG. 5 is a top view of a coil arrangement including multiple parallel coil segments including adjacent elements having current flowing through them in opposite directions, wherein the segments are in paths having equal physical and electrical lengths between first and second terminals at opposite ends of adjacent lead lines.
Figure 6:
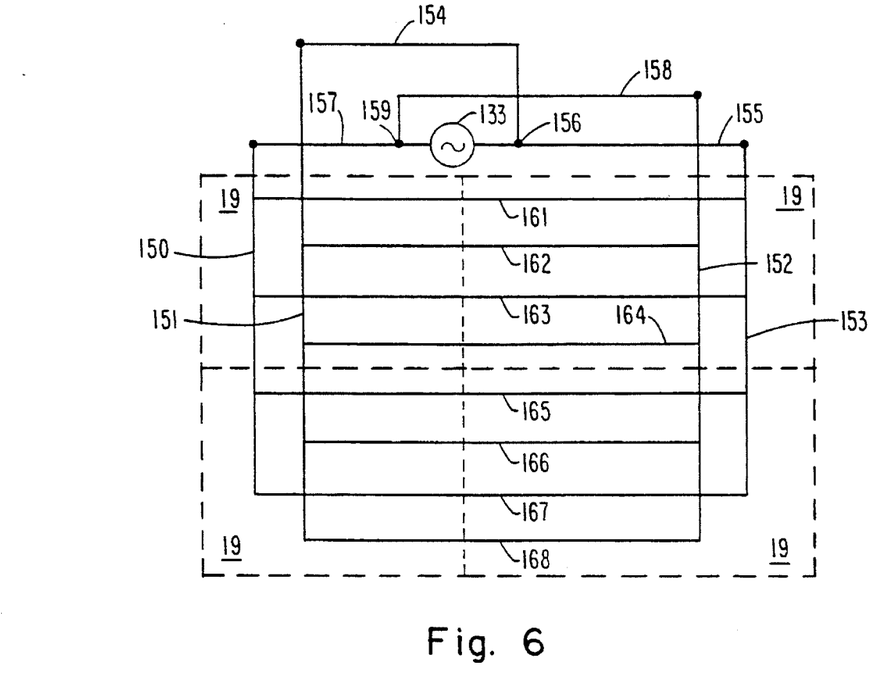
FIG. 6 is a top view of a coil including parallel elements arranged in a woven pattern so current flows in opposite directions in adjacent elements.
Figure 7:
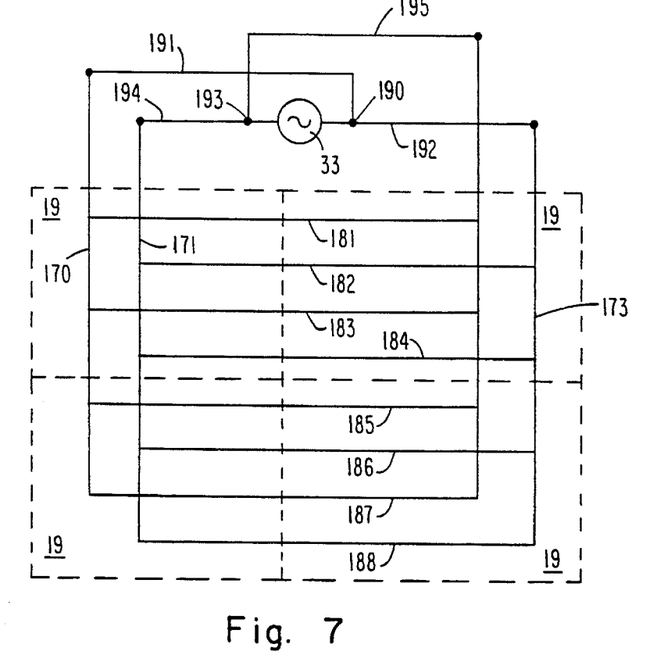
FIG. 7 is a modification of the woven pattern structure illustrated in FIG. 6.

According to further embodiments of the invention, illustrated in FIGS. 5–7, the conducting elements of coil 34 are arranged so current generally flows in adjacent linear conducting elements of the coil in spatially opposite directions at any instant of time. The structure of FIG. 5 has the advantage of providing current paths with equal physical and electrical lengths through each of the conductors between opposite terminals of r.f. excitation device 33. While the magnetic fluxes coupled to the plasma by the structures of FIGS. 5–7 have lower density than those of FIGS. 2–4, in some instances it may be desirable to tailor the flux density to certain regions of the plasma as can be more easily provided with the structures of FIGS. 5–7 than those of FIGS. 2–4.

The structure of FIG. 5 includes spatially adjacent and parallel, elongated straight leads 100 and 102, respectively having terminals 104 and 106 at spatially opposite ends thereof, connected to opposite terminals 66 and 72 of r.f. excitation device 33. Coil 34 of FIG. 5 includes four segments 111, 112, 113 and 114, each including a pair of elongated, linear straight parallel conducting elements, having opposite end terminals respectively connected to leads 100 and 102. Leads 100 and 102 are generally positioned to one side of segments 111–114 so the conducting elements extend in the same direction to the side of interior lead 102. The coil segments and conducting elements are arranged so coil segment 111 includes conducting elements 116 and 117, coil segment 112 includes conducting elements 118 and 119, coil segment 113 includes conducting elements 120 and 121 and coil segment 114 includes conducting elements 122 and 123. The parallel conducting elements of coil segments 111–114 are connected to each other by conducting elements 125 that extend parallel to leads 100 and 102. Conducting elements 116–123 are generally equispaced from each other so that, for example, conducting element 117 of coil segment 111 is spaced the same distance from conducting element 118 of coil segment 112 as it is spaced from conducting element 116 of coil segment 111. Each of the transmission lines including coil segments 111–114 has the same physical and electrical length between opposite terminals 104 and 106 because (1) of the geometry of the layout of coil segments 111–114 and leads 100 and 102, (2) each of segments 111–114 has the same cross sectional and longitudinal geometry and (3) leads 100 and 102 have the same cross sectional and longitudinal geometries.

A further configuration for providing spatially parallel conducting elements that are electrically connected in parallel and have adjacent conducting elements with currents flowing generally in opposite directions is illustrated in FIG. 6 as a woven pattern including straight elongated linear leads 150, 151, 152 and 153, in combination with straight elongated linear conducting elements 161–168. Leads 150–153 extend spatially parallel to each other, and at right angles to conducting elements 161–168 that are generally equispaced from each other and spatially extend parallel to each other. Leads 150, 151 are on one side of elements 161–168 while leads 152 and 153 are on the other side of these elements. Leads 151 and 153 are respectively connected by cables 154 and 155 to a first terminal 156 of r.f. excitation device 33 while leads 150 and 152 are respectively connected by cables 157 and 158 to a second, opposite terminal 159 of the device 33. Alternate equal length conducting elements 161, 163, 165 and 167 are electrically connected between leads 150 and 153, while the remaining, equal length conducting elements 162, 164, 166 and 168 are electrically connected in parallel between leads 151 and 152. Because elements 161, 163, 165 and 167 are connected to exterior leads 150 and 153 and elements 162, 164, 166 and 168 are connected to interior leads 151 and 152, the former elements are longer than the latter. Thereby, at any instant of time, currents generally flow in the same direction through conducting elements 161, 163, 165 and 167, which is opposite from the direction currents generally flow through conducting elements 162, 164, 166 and 168. Magnetic flux paths similar to those provided by the structure illustrated in FIG. 5 are thus established by the coil arrangement of FIG. 6. Because the physical distance between terminals 156 and 159 via the transmission lines including elements 161–168 differ, it is preferable to change the cross sectional geometry of leads 150–153 in a manner similar to that described for FIG. 2 or to connect capacitors in series with elements 161–169 as described for FIG. 2a.

The woven coil arrangement of FIG. 6 can be modified, as illustrated in FIG. 7, so each of the conducting elements has the same length. To these ends, the woven coil structure of FIG. 7 includes elongated, parallel straight leads 170, 171, 172 and 173, in combination with elongated, parallel straight conducting elements 181–188. Leads 170–173 extend at right angles to equispaced conducting elements 181–188. Exterior leads 170 and 173 are connected to terminal 190 of r.f. excitation device 33 by cables 191 and 192, respectively. Interior leads 171 and 172 are connected to terminal 193 of r.f. excitation device 33 by cables 194 and 195, respectively. Conducting elements 181, 183, 185 and 187 are electrically connected in parallel across leads 170 and 172, while conducting elements 182, 184, 186 and 188 are electrically connected in parallel across leads 170 and 172. Thereby, generally oppositely directed currents flow through adjacent pairs of leads 181–188 so that, for example, when current is flowing through conducting element 182 from lead 170 to lead 172, current is flowing through conducting elements 181 and 183 from lead 173 to lead 171. Hence, current flows in opposite directions in adjacent conducting elements in a similar manner in the embodiments of FIGS. 6 and 7.

Figure 12:
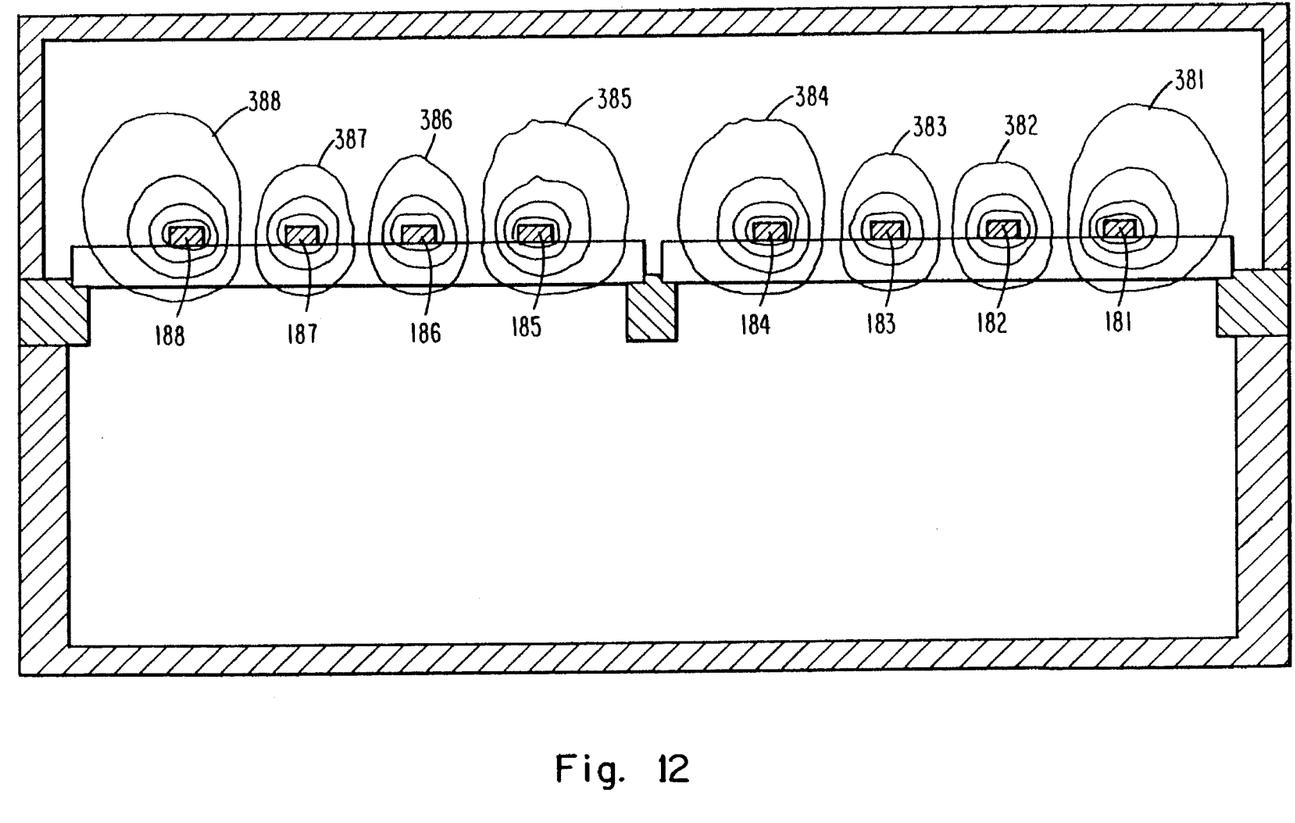
FIG. 12 is a side sectional view of magnetic flux lines resulting from excitation of the coil configurations of FIGS. 5–8 and 10.

In response to excitation of the coils illustrated in FIGS. 5–7 by r.f. excitation device 33, magnetic lines of flux, as illustrated in FIG. 12 are produced. In FIG. 12, magnetic flux lines 381–388 are respectively associated with the equal length conducting elements 181–188 of FIG. 7; it is to be understood that similar flux line patterns are obtained for conducting elements 116–123 of FIG. 5 and conducting elements 161–168. Because current flows in opposite directions in adjacent ones of elements 181–188, the magnetic flux lines resulting from these currents buck each other so there is no interaction of flux patterns 381–388 and there is flux null between adjacent conducting elements. Since there is no conducting element or magnetic member on the exterior sides of conducting elements 181 and 188, magnetic flux lines 381 and 388 bulge away from the center of coil 34. Because conducting elements 184 and 185 are spaced farther apart than other pairs of the conducting elements (due to rail 21), magnetic flux lines 384 and 385 bulge toward center dielectric rail 21. The interior equispaced positions of conducting elements 182, 183, 186 and 187 cause flux lines 382, 383, 386 and 387 to have about the same density and spatial configuration.

Figure 8:
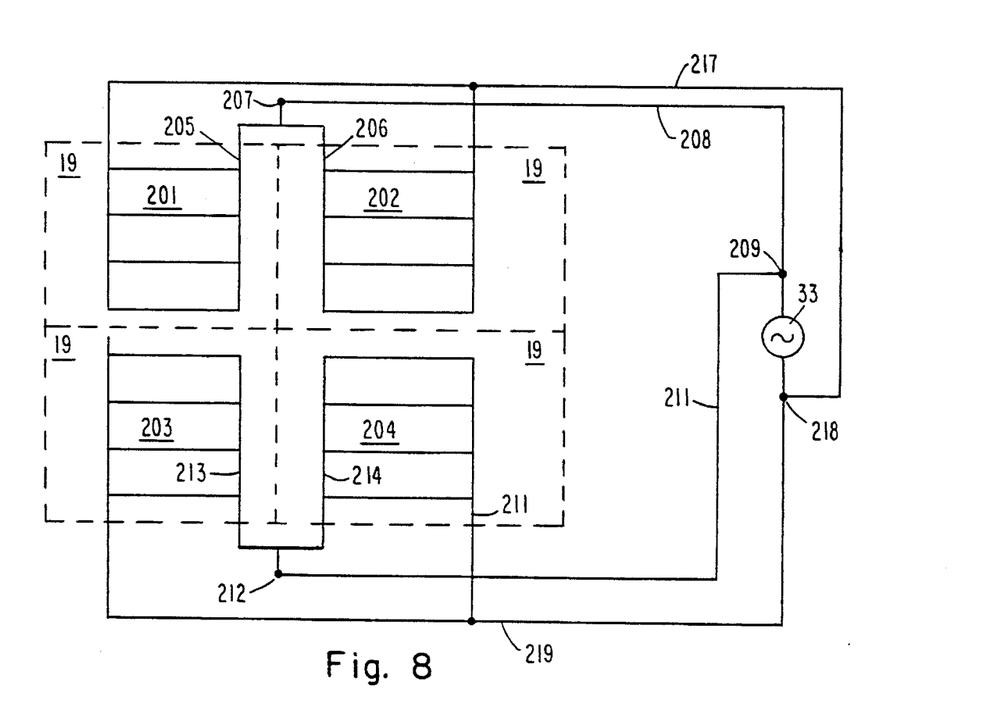
FIG. 8 is a top view of a coil configuration having plural coil portions, each occupying a mutually exclusive area on a different individually supported window and connected in parallel to an excitation source.

The coil structures illustrated in FIGS. 2–7 are designed to extend over all four windows 19 of top end plate structure 18. In certain instances, however, it is desirable to provide individual coils on each of windows 19. To this end, any of the coil structures described in connection with FIGS. 2–7 can be connected in parallel and separately overlay each of windows 19, as illustrated in FIG. 8. In the particular embodiment of FIG. 8, each of windows 19 is overlaid by separate coil segments 201, 202, 203 and 204, each constructed generally in the manner described in connection with FIG. 4. Adjacent interior leads 205 and 206 of coil segments 201 and 202 are connected to terminal 207, connected by cable 208 to terminal 209 of r.f. excitation device 33. Terminal 209 is also connected by cable 211 to terminal 212, in turn connected to interior adjacent leads 213 and 214 of coil segments 203 and 204. Exterior leads 215 and 216 of coil segments 201 and 202 are connected by cable 217 to the other terminal 218 of r.f. excitation device 33. Terminal 218 is also connected by cable 219 to exterior leads 220 and 221 of coil segments 203 and 204. Thereby, segments 201–204 of coil 34, as illustrated in FIG. 8, are driven in parallel by device 33. Each of the coil segments has electrically parallel conducting elements with relatively short lengths (no more than 1/16th of a wavelength of the wave derived by device 33) to minimize the likelihood of voltage and/or current nulls therein. Because the four coil segments 201–204 are relatively short transmission lines it may not be necessary in certain instances for all of the individual transmission lines on the individual windows 19 to have the same length.

Figure 9:
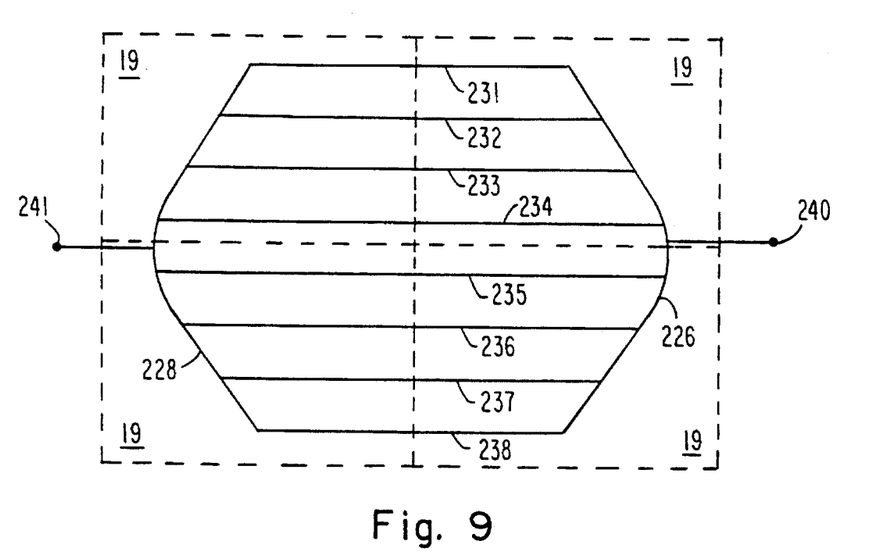
FIG. 9 is a top view of a coil including plural parallel linear segments having differing lengths.

In each of the embodiments of FIGS. 2–8, the conducting elements of the various planar coils have equal physical lengths. It is not necessary, however, for the conducting elements to have equal physical lengths, and in some instances it may be desirable for the physical lengths thereof to differ. In the embodiment of FIG. 9, the structure of FIG. 2 is modified to include arcuate leads 226 and 228 between which extend spatially parallel elongated straight conducting elements 231–238 having differing physical lengths. Midpoints of arcuate leads 226 and 228 include terminals 240 and 241, respectively connected to opposite polarity terminals of r.f. excitation device 33. Currents flow in parallel in generally the same direction through conducting elements 231–238. The structure of FIG. 9 is employed to enable the plasma in chamber 10 to have certain special spatial configurations for treating substrates having appropriate surfaces.

While it is desirable to provide elements 231–238 with different physical lengths, the electrical lengths of the transmission lines including these elements are preferably the same, a result which can be achieved by use of the structures described in connection with FIG. 2 or 2a. Even though elements 231–238 are illustrated as being approximately equispaced from each other, this is not necessarily the case for the configurations of any of FIGS. 2–9.

Figure 10:
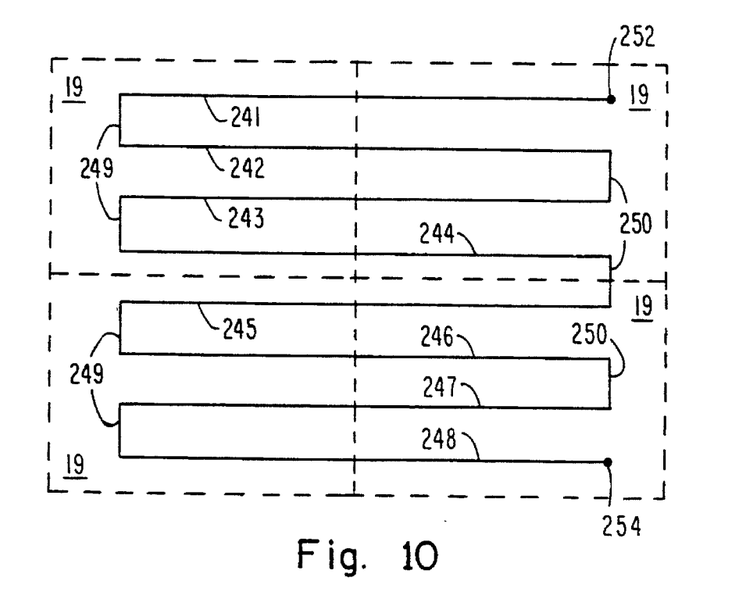
FIG. 10 is a top view of a coil including plural linear elements connected in series between external terminals connected to be responsive to an r.f. source.

A magnetic flux pattern similar to that of FIG. 12 can be provided by forming coil 34 as plural series conducting elements, as illustrated in FIG. 10. The coil of FIG. 10 includes conducting elements 241–248 that extend spatially in parallel to each other, have approximately equal lengths and have adjacent ends connected together by conducting elements 249 and 250. Conducting elements 241 and 248 are connected to end terminals 252 and 254, in turn connected by appropriate cables to opposite end terminals of r.f. excitation device 33. Current thus flows generally in opposite directions in adjacent conducting elements 241–248, as a result of the sinuous or serpentine relationship of these conducting elements. The structure of FIG. 10 has a substantial disadvantage relative to the structures of FIGS. 2–9 because of its long physical and electrical length, whereby there is a tendency for voltage and current nulls along the length of the coil formed by elements 241–248. These nulls cause uneven distribution of magnetic flux acting on the gas in chamber 10. This problem is obviated by the parallel structures of FIGS. 1–9, all of which have conducting elements in parallel with each other across the terminals of r.f. excitation device 33 and lengths that are about 1/16th wavelength of the wave derived by device 33. The structures of all of FIGS. 2–10 have the advantage of being planar coils having exterior terminals, outside of the conducting elements for ease of connection so problems associated with spiral planar coils having one interior terminal are avoided. All of these planar coils, as well as spiral planar coils, can be used as four individual coils, connected in parallel, on the four windows 19 of end plate structure 18, as described in connection with FIG. 8.

Figure 13A:
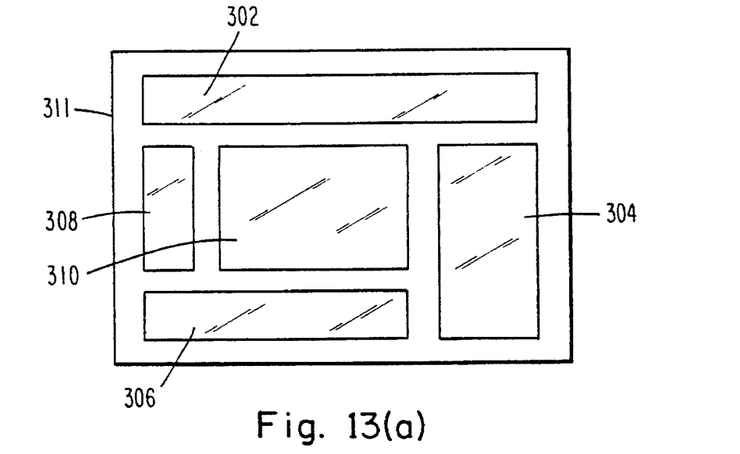
FIGS. 13a–13c are top views of alternate window configurations.
Figure 13B:
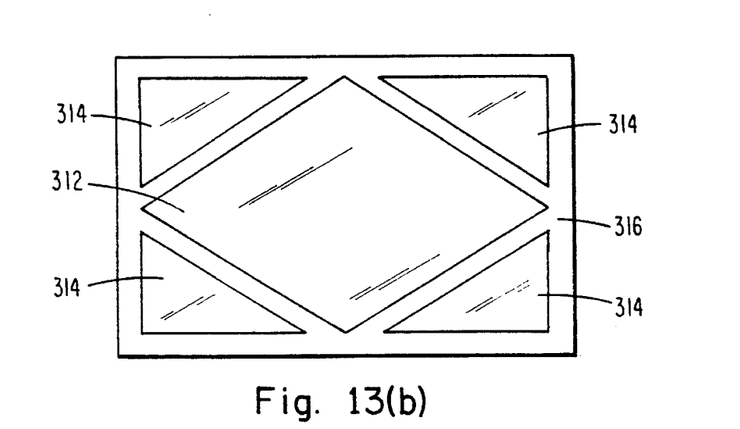
Figure 13C:
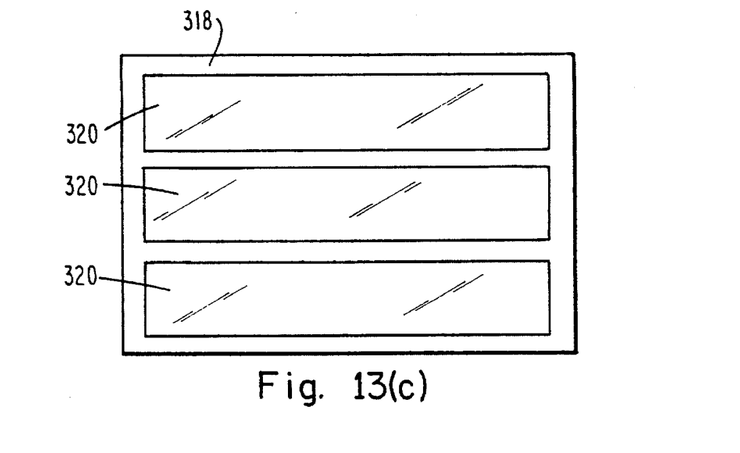

While end plate structure 18 preferably includes four rectangular dielectric windows having the same size and positioned in the quadrants of a rectangular frame, other individually supported dielectric window configurations, e.g. as schematically illustrated in FIGS. 13(a), 13(b) and 13(c), can be employed. Individually supported dielectric windows 302–310, FIG. 13(a), in frame 317, have different sizes and shapes such that rectangular peripheral windows 302–308 have different lengths, extend at mutually right angles and surround interior square window 310. In FIG. 13(b) diamond shaped, centrally located dielectric window 312 and triangle shaped exterior dielectric windows 314 are individually supported in frame 316. Frame 318, FIG. 13(c), individually supports three rectangular windows 320, each having the same size and parallel long sides. Planar coils, as illustrated in FIGS. 2–10, are laid on the windows of FIGS. 13(a), 13(b) and 13(c).

While there have been described and illustrated specific embodiments of the invention, it will be clear that variations in the details of the embodiments specifically illustrated and described may be made without departing from the true spirit and scope of the invention as defined in the appended claims.

What is claimed is:

1. A device for treating a workpiece with a plasma comprising a vacuum chamber in which the workpiece is adapted to be mounted, means for introducing into the chamber a gas which can be converted into the plasma for treating the workpiece, means for converting the gas into the plasma including an electric source for producing an r.f. field originating outside of the chamber, plural individually supported dielectric windows on an exterior surface of the chamber positioned to couple the r.f. field to the gas so the field coupled through the windows excites the plasma, the windows having a thickness substantially less than the thickness of a single window having the same combined area as the plural windows to withstand the differential pressure between the interior and exterior of the chamber.

2. The device of claim 1 wherein the electric source includes a single excitation device for producing the r.f. field that is coupled through the plural windows.

3. The device of claim 2 wherein the excitation device includes a single coil array that extends over the plural windows, the r.f. field being a magnetic field derived from the array.

4. The device of claim 3 wherein the coil array includes a planar coil that extends over the plural windows.

5. The device of claim 3 wherein the coil array has a pair of terminals connected to several electrically parallel segments via a pair of leads, the electrical length for current flow from the terminals through each of the segments being about the same.

6. The device of claim 3 wherein the coil has a pair of terminals connected to several electrically parallel segments via a pair of leads, the electrical and physical lengths for current flow from the terminals through each of the segments being about the same.

7. The device of claim 1 wherein the electric source includes plural excitation devices, one for and associated with each window, each excitation device being positioned to produce the r.f. field that is coupled through the associated window.

8. The device of claim 7 wherein each of the excitation devices includes a coil array positioned adjacent the window associated with the excitation device, the r.f. field including magnetic lines of flux derived from the coil arrays associated with the plural windows.

9. The device of claim 8 wherein each coil array includes a substantially planar coil that is positioned adjacent a particular window.

10. The device of claim 8 wherein the coil arrays are electrically connected in parallel.

11. The device of claim 10 wherein each of the coil arrays has about the same electrical length.

12. The device of claim 11 wherein each coil array has a pair of terminals connected to several electrically parallel segments via a pair of leads, the electrical length for current flow from the terminals through each of the segments being about the same.

13. The device of claim 11 wherein each coil array has a pair of terminals connected to several electrically parallel segments via a pair of leads, the electrical and physical lengths for current flow from the terminals through each of the segments being about the same.

14. The device of claim 1 wherein the surface includes a frame having plural openings, each with a separate window support structure, one of the windows being located in each of the openings and being carried by the support structure of the associated opening.

15. The device of claim 1 wherein the surface includes a frame having four openings arranged in quadrants, each opening including a separate window support structure, one of the windows being located in each of the openings and being carried by the support structure of the associated opening.

16. A device for treating a workpiece with a plasma comprising a vacuum chamber in which the workpiece is adapted to be mounted, means for introducing into the chamber a gas which can be converted into the plasma for treating the workpiece, means for converting the gas into the plasma including a dielectric window on an exterior surface of the chamber, a coil positioned to couple an r.f. magnetic field to the gas via the window for exciting the gas to a plasma state, the coil including first and second terminals adapted to be connected to an r.f. source that causes the r.f. magnetic field to be derived and plural winding segments connected in parallel between the first and second terminals, at least two of the winding segments being in paths having about the same electric length between the first and second terminals.

17. The device of claim 16 wherein a plurality of dielectric windows are included, the coil extending over said plural dielectric windows.

18. The device of claim 16 wherein a plurality of dielectric windows are included, a separate one of said coils being adjacent each of said windows.

19. The device of claim 18 wherein said separate coils are connected in parallel with each other to said r.f. source.

20. The device of claim 16 wherein the paths have about the same physical lengths between the first and second terminals.

21. The device of claim 20 wherein there are several of said winding segments and an equal number of said paths having about the same electric length between the first and second terminals.

22. The device of claim 21 wherein said several paths and winding segments are arranged so current from the r.f. source generally flows in the same direction through all of the segments at a particular time.

23. The device of claim 22 wherein the coil includes first and second elongated spatially parallel leads having the same cross section geometry, the first and second terminals being at opposite ends of the first and second leads, respectively, each of the several segments including an elongated element extending between the leads and having opposite ends connected to the leads, each of the elements having the same length and cross section geometry.

24. The device of claim 23 wherein each element has a length of no greater than about a $\frac{1}{16}$ of a wavelength of a wave applied by the r.f. source to the coil.

25. The device of claim 21 wherein each segment includes at least one element, the paths, segments and elements being arranged so the elements extend generally parallel to each other and being arranged so the elements extend generally parallel to each other and current from the r.f. source generally flows in opposite directions in the elements that are next to each other.

26. The device of claim 25 wherein the coil includes first and second elongated spatially parallel leads having the same cross section geometry, the first and second terminals being at opposite ends of the first and second leads, respectively, each of the several segments including a pair of series connected elongated elements, the leads, elements and segments being arranged so the leads are adjacent each other generally to one side of the elements.

27. The device of claim 20 wherein the two paths having about the same physical and electrical lengths include: (a) first and second generally parallel elongated leads respectively connected to the first and second terminals, and (b) first and second coil elements that extend between the first and second leads, the terminals being connected to the leads at locations between the two coil segments.

28. The device of claim 16 wherein at least some of the paths having about the same electrical lengths have substantially different physical lengths across the terminals, the paths having substantially different physical lengths and about the same electrical lengths having reactances with different values causing the electrical lengths to be about the same.

29. The device of claim 25 wherein each of the paths has the same type of dominant reactive impedance value at the frequency of the current applied by the r.f. source to the coil.

30. The device of claim 29 wherein each of the paths includes an element connected between a pair of leads connected to the first and second terminals, each element having about the same physical and electrical length.

31. The device of claim 30 wherein each element has a length of no greater than about a $1/16$ of a wavelength of a wave applied by the r.f. source to the coil.

32. The device of claim 29 wherein at least one of said leads has differing values of inductance between connections with adjacent pairs of said elements.

33. The device of claim 32 wherein the differing values of inductance are attained by providing the leads with different cross sectional areas between connections with adjacent pairs of said elements.

34. The device of claim 29 wherein at least some of the paths include a series capacitor having a reactive impedance value at the frequency of the current applied by the r.f. source to the coil, the series capacitors causing the paths to have about the same lengths.

35. The device of claim 34 wherein the series capacitors have values causing each path to have a dominant capacitive impedance value at the frequency of the current applied by the r.f. source to the coil.

36. The device of claim 34 wherein the series capacitors have values causing each path to have a dominant inductive impedance value at the frequency of the current applied by the r.f. source to the coil.

* * * * *